United States Patent
Huber et al.

(10) Patent No.: US 6,883,228 B1
(45) Date of Patent: Apr. 26, 2005

(54) INSERTION HEAD WITH A TWISTING DEVICE FOR ELECTRICAL COMPONENTS

(75) Inventors: Wolfgang Huber, Munich (DE); Mohammad Mehdianpour, Munich (DE); Ralf Schulz, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/070,031

(22) PCT Filed: Apr. 3, 2000

(86) PCT No.: PCT/DE00/01025

§ 371 (c)(1),
(2), (4) Date: Oct. 19, 2001

(87) PCT Pub. No.: WO00/65893

PCT Pub. Date: Nov. 2, 2000

(30) Foreign Application Priority Data

Apr. 21, 1999 (DE) .......................... 199 18 056
Dec. 21, 1999 (DE) .......................... 199 61 778

(51) Int. Cl.[7] ............................................... H05K 3/30
(52) U.S. Cl. ............................. 29/740; 29/739; 29/720; 29/732; 29/834
(58) Field of Search .................. 29/740, 739, 730, 29/832, 834

(56) References Cited

U.S. PATENT DOCUMENTS

| 3,946,931 | A | * | 3/1976 | Bahnck et al. | 228/102 |
| 4,626,167 | A | * | 12/1986 | Bond et al. | 414/806 |
| 4,653,664 | A | * | 3/1987 | Hineno et al. | 221/3 |
| 4,706,379 | A | * | 11/1987 | Seno et al. | 29/740 |
| 4,858,308 | A | * | 8/1989 | Komori | 29/740 |
| RE35,027 | E | * | 8/1995 | Ragard | 29/740 |

FOREIGN PATENT DOCUMENTS

| EP | 0 315 799 B1 | 5/1989 |
| EP | 0 691 805 A1 | 1/1996 |
| EP | 0 906 011 A2 | 3/1999 |
| FR | 2 661 309 | 10/1991 |

* cited by examiner

*Primary Examiner*—Richard Chang
(74) *Attorney, Agent, or Firm*—Schiff Hardin LLP

(57) ABSTRACT

A turret-like insertion head having at least one twisting device for mounting electrical components. The insertion head has a stator, a rotor and an optical measuring device. A plurality of circularly distributed grippers are mounted on the rotor such that the grippers can rotate about a mounting axis. The optical measuring device detects the position of the components held on the grippers, and as a result, a component can be twisted into its approximate mounting position during forward movement of the gripper before making a final position measurement, thereby saving time.

8 Claims, 1 Drawing Sheet

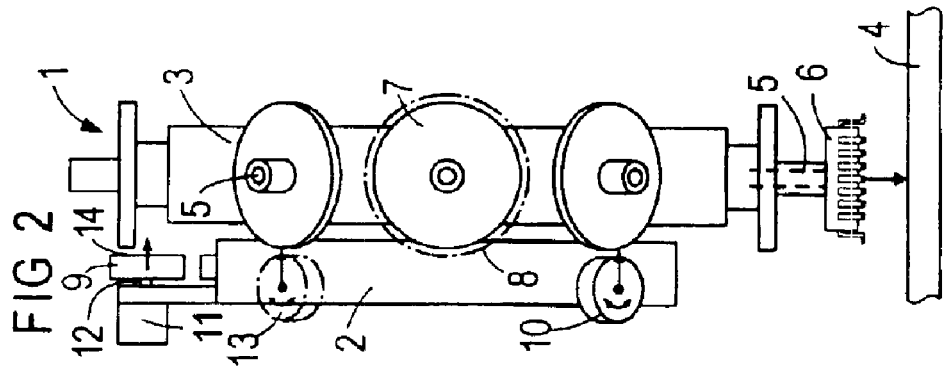
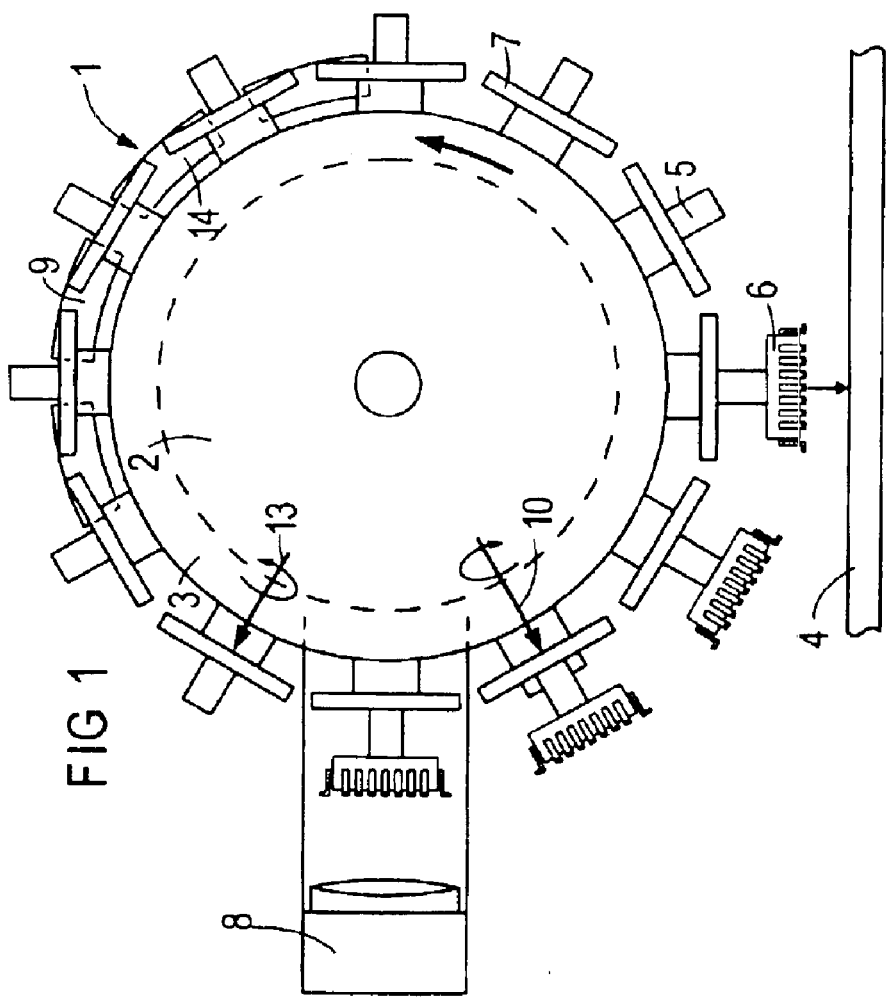

INSERTION HEAD WITH A TWISTING DEVICE FOR ELECTRICAL COMPONENTS

BACKGROUND OF THE INVENTION

1. Field of the Invention

The present invention relates to an insertion head having at least one twisting device for electrical components, the turret-like insertion head having a stator and a rotor, on which a large number of circularly distributed grippers are mounted such that they can rotate about a mounting axis, the insertion head having an optical measuring device for detecting the position of the components held on the grippers, and it being possible for the components to be twisted accurately into the required mounting position by a precision twisting device after being measured optically.

2. Description of the Related Art

European Patent Document EP-C 0 315 799 discloses providing an insertion device with a moveable turret head, in which the grippers provided with suction pipettes are arranged on a rotor such that they stand out in star fashion. A stator of the insertion head is provided with processing stations distributed circumferentially.

It is usual to design one of these stations as an optical measuring station, in which the rotational position of the component previously picked up is determined. In a subsequent twisting station, the position of the component is changed in accordance with the desired installation position. This change includes a coarse twist, for example in 45° steps, corresponding to the desired installation position, and precision twisting, by means of which the fetching-in accuracy in picking up the components from a feed device is compensated for.

In addition, it is usual to provide the gripper with a disk-like slewing ring of relatively great diameter. On said ring, a friction wheel of the twisting device can be placed radially, whereupon the twisting device is activated and exact twisting of the gripper through a precalculated angle is effected. Since the components are to be placed onto the printed circuit board in different installation positions, the twisting angle may be so large that the entire twisting cycle lasts longer than the operating cycles on other stations of the turret head, which accordingly limits its insertion performance.

SUMMARY OF THE INVENTION

The invention is based on the object of reducing the time loss when twisting the grippers.

This object is achieved by the invention of an insertion head having at least one twisting device for electrical components, the turret-like insertion head having a stator and a rotor, on which a large number of circularly distributed grippers are mounted such that they can rotate about a mounting axis, the insertion head having an optical measuring device for detecting the position of the components held on the grippers, it being possible for the components to be twisted accurately into the required mounting position by a precision twisting device after being measured optically, wherein, before being measured, the components can be twisted into a position approximating the mounting position by means of a coarse twisting device.

The rotation of the gripper is now distributed to two stages, the coarse twisting being carried out quickly without particular accuracy in a twisting segment before the optical measuring device. As a result, even in the case of a large overall twisting angle, the twisting angle in the precision twisting device can be shortened to such an extent that the precision adjustment does not last longer than, for example, than the optical measurement in the measuring device.

Advantageous developments of the invention provide that the rotor can be twisted step by step with respect to the stator, the optical measuring device is designed as a measuring station, and the precision twisting device is designed as a precision twisting station anchored to the stator. Specifically, the coarse twisting device anchored to the stator is designed as a coarse twisting station associated with a holding station for the grippers. The gripper having a slewing ring, which can be brought peripherally into frictional engagement with at least one friction surface on the twisting device, it being possible for the friction surface to be placed on the slewing ring in the radial direction and it being possible for the gripper to be twisted by means of a tangential relative movement between the twisting device and the slewing ring, wherein the stationary friction surface of the coarse twisting device extends along the movement path of the gripper that can be twisted together with the rotor, and the rolling length on the friction surface can be varied by means of the controlled feed of the friction surface onto the slewing ring. In one embodiment, the coarse twisting device permits a rotational adjustment of the gripper in coarse basic steps. The friction surface is formed on a radially adjustable friction block that is anchored to the stator. The segmented friction surface is formed by a plurality of individually adjustable friction blocks, whose frictional length corresponds to the rotational angle of a basic step. Preferably, the friction surfaces are shorter than the distance between two of the mutually adjacent slewing rings.

The development providing that in that the rotor can be twisted step by step with respect to the stator, the optical measuring device is designed as a measuring station, and the precision twisting device is designed as a precision twisting station anchored to the stator means that the measurement and the precision twisting of the components take place at a standstill.

The measuring station and precision twisting station, and also the coarse twisting station which is anchored to the stator and associated with a holding station for the grippers are fixed to the stator in a simple way and can enter into a precise operative connection with the component or with the gripper.

By means of the frictional surface on the twisting device which extends along the movement path of the gripper that can be twisted together with the rotor and in by which the rolling length on the friction surface can be varied by means of the controlled feed of the friction surface onto the slewing ring, the coarse twisting is carried out without any time loss during the forward movement of the gripper which is required in any case. The stationary friction surface can be formed on a simple constructional part, on which the slewing ring rolls until the desired end position has at least approximately been reached. The length of the engagement between the friction surface and the slewing ring can be terminated accurately by means of a radial feeding movement of the twisting device, for example with the aid of piezoelectric drive elements with a short reaction time, so that the gripper can be twisted through the calculated angle.

The development in which the coarse twisting device permits a rotational adjustment of the gripper in coarse basic steps makes it possible to carry out the coarse twisting with little control effort.

The friction block in which the friction surface is formed on a radially adjustable friction block that is anchored to the stator constitutes a simple component which is easy to operate.

The development that the segmented friction surface is formed by a plurality of individually adjustable friction blocks whose frictional length corresponds to the rotational angle of a basic step makes it possible to design the length of the friction surfaces in such a way that a twisting angle of 45°, for example, is achieved at the gripper in each case. Multiplication of the twisting angle is made possible by an appropriate number of adjustable friction blocks which can be switched into the movement path of the slewing ring.

The development that the friction surfaces are shorter than the distance between two of the mutually adjacent slewing rings ensures that the grippers with the stewing rings can be moved along a precisely defined path. For example, in the case of a stepper-like turret head with radially projecting grippers, the slewing rings move in one plane, so that the friction blocks can also be arranged in one plane, which is associated with mounting advantages. Shortening the frictional length ensures that each friction surface is in each case occupied by only one stewing ring. As a result, the latter can be twisted differently and individually, as predefined.

BRIEF DESCRIPTION OF THE DRAWINGS

In the following text, the invention will be explained in more detail using an exemplary embodiment illustrated in the drawing.

FIG. 1 shows a side view of an insertion head for populating electrical printed circuit boards with components, and FIG. 2 shows a different side view of the insertion head according to FIG. 1.

DETAILED DESCRIPTION OF THE PREFERRED EMBODIMENTS

According to FIGS. 1 and 2, a turret-head-like insertion head 1 comprises a stator 2 and a rotor 3. The insertion head can be moved over a printed circuit board 4 and has grippers 5 which project radially in a star-like manner and are provided with suction pipettes, at whose free ends electrical components 6 are held. The rotor can be rotated step by step through an index angle, which corresponds to the pitch angle of the grippers 5. The grippers 5 can be pushed telescopically out of the rotor. The gripper 5 located in the mounting position in each case can therefore place the component 6 on the printed circuit board 4 in the vertical arrow direction shown.

The rotatably mounted grippers 5 are provided with slewing rings 7 shaped like disks. An optical measuring station 8 is used to measure the position of the components 6 with respect to the gripper 5. Fitted to the stator 2, along the movement path of the slewing rings 7, are friction blocks 9, which can be deflected in the horizontal arrow direction to such an extent that their friction surfaces 14 can be placed on the slewing rings 7. When the rotor 3 is twisted, the slewing rings 7 therefore roll with their outer surfaces on the friction surfaces 14 and are accordingly twisted. This twisting takes place in a time-saving manner between the holding stations of the rotor 3. The length of the friction blocks 9 is such that the grippers 5 are in each case twisted through 45°, for example.

By switching the braking-block feed on and off, the gripper can be twisted by any desired multiple of the coarse twisting angle. Following this coarse twisting, the components 6 are measured in the optical station, and their deviation from the installation position is determined. A subsequent precision twisting device 10 is associated with one of the holding stations. In said device, the rotational position of the gripper 5 can be changed in fine steps, and the desired installation position of the component can also be corrected.

The friction blocks 9 are part of a coarse twisting device 11 and are connected to the latter via piezoelectric drive elements 12, which adjust the friction block 9 in the direction of the slewing ring 7.

Instead of the coarse twisting device 11 with the friction blocks 8, a coarse twisting station (13), indicated by dash-dotted lines, can also be arranged on the stator of a holding station of the grippers 5, being of the same construction as the precision twisting station 10.

Although other modifications and changes may be suggested by those skilled in the art, it is the intention of the inventors to embody within the patent warranted hereon all changes and modifications as reasonably and properly come within the scope of their contribution to the art.

What is claimed is:

1. A device for mounting electrical components, the device comprising a turret-like insertion head having at least one precision twisting assembly, a coarse twisting assembly, a stator, and a rotor including a plurality of circularly distributed grippers for holding the components to be mounted, the rotor being disposed for rotation about a mounting axis, and the insertion head further having an optical measuring device for detecting a position of components held by the gripper, whereby the components to be mounted are twisted into a position approximating a desired mounting position by the coarse twisting assembly before being optically measured, and the components to be mounted are accurately twisted into the desired mounting position by the precision twisting device after being optically measured.

2. The device as claimed in claim 1, wherein the rotor can be twisted step by step with respect to the stator, the optical measuring device serves as a measuring station, and the precision twisting assembly serves as a precision twisting station anchored to the stator.

3. The device as claimed in claim 2, wherein the coarse twisting assembly anchored to the stator serves as a coarse twisting assembly associated with a holding station for the grippers.

4. The device as claimed in claim 3, wherein the gripper includes a slewing ring which can be brought peripherally into frictional engagement with at least one friction surface on the coarse twisting assembly and the precision twisting assembly, and the frictional surface is placed on the slewing ring in a radial direction such that the gripper to be twisted in a tangential relative movement between the coarse twisting assembly, the precision twisting assembly and the slewing ring, whereby the friction surface of the coarse twisting assembly extending along the movement path of the gripper can be twisted together with the rotor and the rolling path on the frictional surface can be varied by a controlled feed of the friction surface onto the slewing ring.

5. The device as claimed in claim 4, wherein the coarse twisting device permits a rotational adjustment of the gripper in coarse basic steps.

6. The device as claimed in claim 4, wherein the frictional surface is formed on a radially adjustable friction block anchored to the stator.

7. The device as claimed in claim 5, wherein the friction surface is formed by a plurality of individually adjustable friction blocks, whose frictional length corresponds to the rotational angle of a basic step.

8. The device as claimed in claim 6, wherein the adjustable friction blocks are shorter than the distance between any two mutually adjacent slewing rings.

* * * * *